United States Patent
Cho et al.

(10) Patent No.: US 6,650,567 B1
(45) Date of Patent: *Nov. 18, 2003

(54) NONVOLATILE SEMICONDUCTOR MEMORIES WITH A NAND LOGIC CELL STRUCTURE

(75) Inventors: Sung-Hee Cho, Suwon (KR); Sang-Ki Hwang, Suwon (KR); Hyong-Gon Lee, Suwon (KR)

(73) Assignee: Samsung Electronics Co., Ltd., Kyungki-do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/213,004

(22) Filed: Mar. 14, 1994

(30) Foreign Application Priority Data

Mar. 14, 1993 (KR) .............................................. 93-3738

(51) Int. Cl.[7] .............................................. G11C 16/04
(52) U.S. Cl. ............................ 365/185.17; 365/185.05; 365/230.06
(58) Field of Search ............................. 365/185, 230.06, 365/104, 185.17, 185.05

(56) References Cited

U.S. PATENT DOCUMENTS

| 5,050,125 A | * | 9/1991 | Momodomi | 365/189.09 |
| 5,204,839 A | * | 4/1993 | Lee et al. | 365/185 |
| 5,253,206 A | * | 10/1993 | Tanaka | 365/185.17 |

* cited by examiner

*Primary Examiner*—Richard Elms
*Assistant Examiner*—Jung H. Hur
(74) *Attorney, Agent, or Firm*—Lee & Sterba, P.C.

(57) ABSTRACT

A nonvolatile semiconductor integrated circuit having a cell array consisting of a plurality of memory strings each having first to N-th (N=2, 3, 4, . . . ) memory cell transistors of a NAND structure includes a plurality of first string select transistors connected in series to the first memory cell transistor, and a plurality of second string select transistors connected in series to the N-th memory cell transistor. One of the string select transistors serially connected to the first and N-th memory cell transistors has a control terminal connected to a ground connecting point, thus to have a ground select function as well as a string select function.

12 Claims, 7 Drawing Sheets

NONVOLATILE SEMICONDUCTOR MEMORIES WITH A NAND LOGIC CELL STRUCTURE

BACKGROUND OF THE INVENTION

The present invention relates to nonvolatile semiconductor memories, and more particularly to nonvolatile semiconductor memories with a NAND logic memory cell structure.

A nonvolatile semiconductor memory such as an EEPROM (Electrically Erasable and Programmable Read Only Memory) or MROM (Mask Read Only Memory) has a memory cell structure based on NOR logic or NAND logic. A NAND logic structure requires fewer select transistors per cell and fewer contact holes between bit lines; accordingly, a NAND logic memory cell structure is used in most nonvolatile semiconductor memories. A typical NAND logic memory cell consists of a plurality of unit memory strings each having a memory cell transistor for storing data and string select means for selecting a unit memory string in which a desired memory cell transistor is located. U.S. Pat. No. 4,142,176, issued on Feb. 27, 1979 discloses a nonvolatile semiconductor memory having a cell array wherein string select means and a NAND logic memory cell transistor are serially connected. Specifically, in a plurality of unit memory strings constituting a cell array, a string select transistor for selecting a memory string is serially connected to a plurality of series-connected memory cell transistors for storing data, and a power supply line and a bit line are respectively connected to both ends of the string select transistor and the memory cell transistor. During a data access operation, a voltage is supplied to the bit line, a string operation of the string select transistor results in a selection of and the memory cell transistor on the selected memory string. However, in such a NAND logic memory cell structure, one unit memory string is connected to one bit line. This arrangement is not suitable for high integration of a memory circuit due to the pitch necessarily required between bit lines.

To overcome that disadvantage, an improved structure has been proposed in which two unit memory strings are connected to one bit line, as disclosed in Japanese Patent Provisional Publication No. 2-65170. Referring to FIG. 1, two parallel unit memory strings are connected to a bit line BL selected by a column decoder within a chip. String select transistors MS10A, MS11A, MS20A and MS21A selected by a row decoder and n memory cell transistors M10A, . . . M1nA, M20A, . . . M2nA driven by word lines WL0, . . . , WLn are serially connected to the memory string. Since two string select transistors are connected to one unit memory string, it is possible to independently select two unit memory strings connected to one bit line. During reading and writing operations, only one of two string select transistors is set to logic "high" by an address applied to the chip and simultaneously only one selected word line out of word lines WL0, . . . , WLn is set to logic "low". For example, if string select line SS0 and word line WL0 are selected by a decoded address, the string select lines SS0 and SS1 are respectively set to logic "high" and "low", and the word line WL0 is set to logic "low". All other word lines are set to logic "high". The string select transistor MS10A constituting the memory string is an enhancement transistor having a positive threshold voltage and the string select transistor MS11A is a depletion transistor having a negative threshold voltage. The memory cell transistors are either enhancement or depletion transistors according to a programmed state.

Therefore, the string select transistors MS10A, MS11A and MS20A are turned on and the string select transistor MS21A is turned off. The bit line BL0 is electrically connected to a connecting point A, and insulated from a connecting point B by the string select transistor MS21A. Since it is an enhancement transistor, the memory cell transistor M1nA becomes conductive irrespective of the programmed state and connected or disconnected to a ground connecting point C depending on the threshold voltage of the memory cell transistor M10A whose gate is connected to the word line WL0. If the memory cell transistor M10A is a depletion transistor, the bit line BL0 is electrically connected to the ground connecting point C. If the memory cell transistor M10A is an enhancement transistor, the bit line BL0 is insulated from the ground connecting point C. The voltage of the selected memory cell is typically read out by a sense amplifier (not shown) connected to the bit line.

Referring still to FIG. 1, the voltage level of the word lines WL0, . . . , WLn is set to logic "high" during a stand-by state. Hence, a gate film of the memory cell transistor may break due to the stress generated by this voltage level, defects in a manufacturing process, or the like. In a very large scale semiconductor integrated circuit including minimally-sized memory cells, this possibility is increased. When defects occur in memory cell transistors, even if the defects are repaired by an error correcting code (ECC) circuit for example, problems such as increased current consumption resulting from the current path formed during the stand-by state from the word line voltage applied to the destroyed gate film to ground.

Another conventional nonvolatile semiconductor memory having a NAND logic cell structure is disclosed in Korean Patent Application No. 1991-6569, filed Apr. 24, 1991. Referring now to FIG. 2, switching means MG1B, MG2B, . . . are controlled by a ground select signal GSS as a decoding signal. By the switching means MG1B, MG2B, . . . , each memory string is selectively connected to a ground connecting point. That is, the switching means MG1B, MG2B, . . . repairs the increase of current during the stand-by state of a memory device. Even if a transistor selected by word lines WL0, . . . , WLn, bit lines BL0, BL1, . . . , and first and second string select signals SS0 and SS1 forms a current path to the ground connecting point during the stand-by state, since switching transistors MG1B, MG2B, . . . are turned off and on by the ground select signal GSS during the stand-by operation and reading operation, respectively, the increase of the current caused by the breakdown of the gate film of the transistor during the stand-by operation of the chip is prevented. Though not shown in the drawing, the ground select signal GSS is generated by a decoding operation of a row decoder. During a select operation of the memory cell transistor, the ground select signal GSS is logic "high", and during other operation including the stand-by operation, the ground selected signal GSS is logic "low".

However, as the packing density of semiconductor integrated circuits increases, the separation between metal bit lines formed on the semiconductor substrate of a chip decreases significantly. Therefore, a bridge phenomenon, or short, caused by a particle during a manufacturing process may frequently occur, and is difficult to repair. In semiconductor memories 64 Mbits (mega: $10^6$) or 128 Mbits in size, the bit line is generally formed with metal, and the bridge phenomenon is a great obstacle in the manufacturing process.

SUMMARY OF THE INVENTION

It is therefore an object of the present invention to provide a reliable nonvolatile semiconductor memory suitable for increased chip packing density.

It is another object of the present invention to provide a low power consumption nonvolatile semiconductor memory suitable for high integration.

It is yet another object of the present invention to provide a nonvolatile semiconductor memory which prevents a bridge phenomenon between metals in a high integration chip.

It is still another object of the present invention to provide a nonvolatile semiconductor memory with a NAND cell array structure which prevents unnecessary current consumption during a stand-by operation.

It is still yet another object of the present invention to provide a nonvolatile semiconductor memory with a NAND cell array structure for facilitating design.

It is a further object of the present invention to provide a nonvolatile semiconductor memory with a NAND cell array structure which prevents current consumption during a stand-by state due to the breakdown of a gate film of a cell transistor and which is easily integrated with a higher packing density.

In accordance with one aspect of the present invention, a nonvolatile semiconductor memory having a cell array consisting of a plurality of unit memory strings in the row and column directions, a plurality of memory cells whose channels are serially connected constituting one unit memory string, includes at least two string select transistors connected in series to one end of the unit memory string and controlled by a string select signal, and at least two ground select transistors connected in series to the other end of the unit memory string and controlled by a ground select signal; the memory is thus provided with a string select function and a ground select function. In the nonvolatile semiconductor memory embodied according to the present invention, one bit line is connected to two unit memory strings or four unit memory strings. It is preferable to determine the number of unit memory strings connected to one bit line based on the degree of chip integration, the art, etc. Meanwhile, at least two ground select transistors (hereinafter the term "ground select transistor" is used for descriptive convenience and it should be noted that a ground select transistor has a ground select function as well as a string select function) are series connected to one unit memory string prevent a current path from being formed during nonconducting conditions when a particular memory string is not selected.

BRIEF DESCRIPTION OF THE DRAWINGS

The advantages and features of the present invention will be more apparent from the following detailed description, with reference to the attached drawings, in which.

DETAILED DESCRIPTION OF THE PREFERRED EMBODIMENTS

Figure 1:
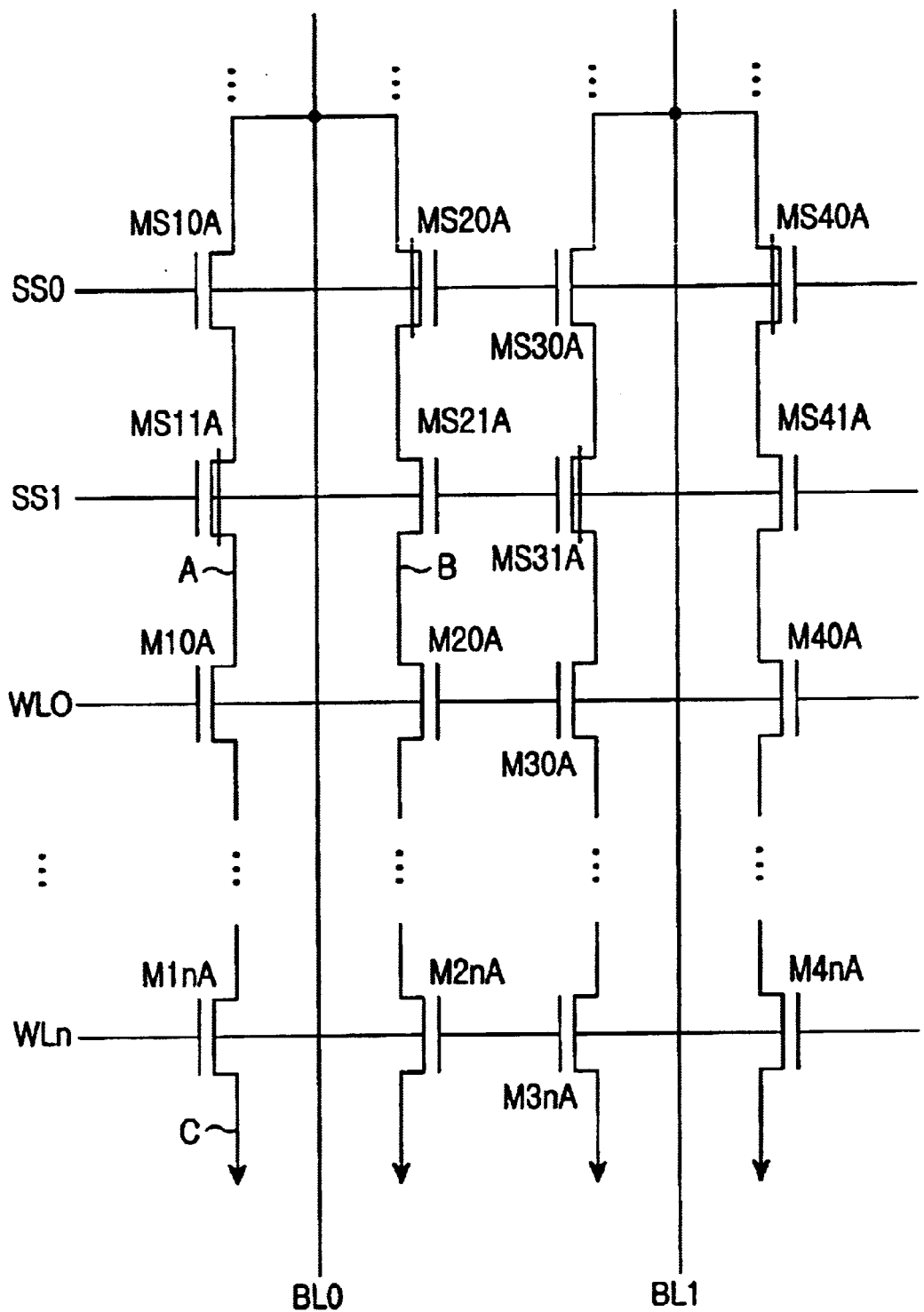
FIG. 1 is a circuit diagram illustrating one example of a cell array with a NAND logic cell structure according to the prior art.
Figure 2:
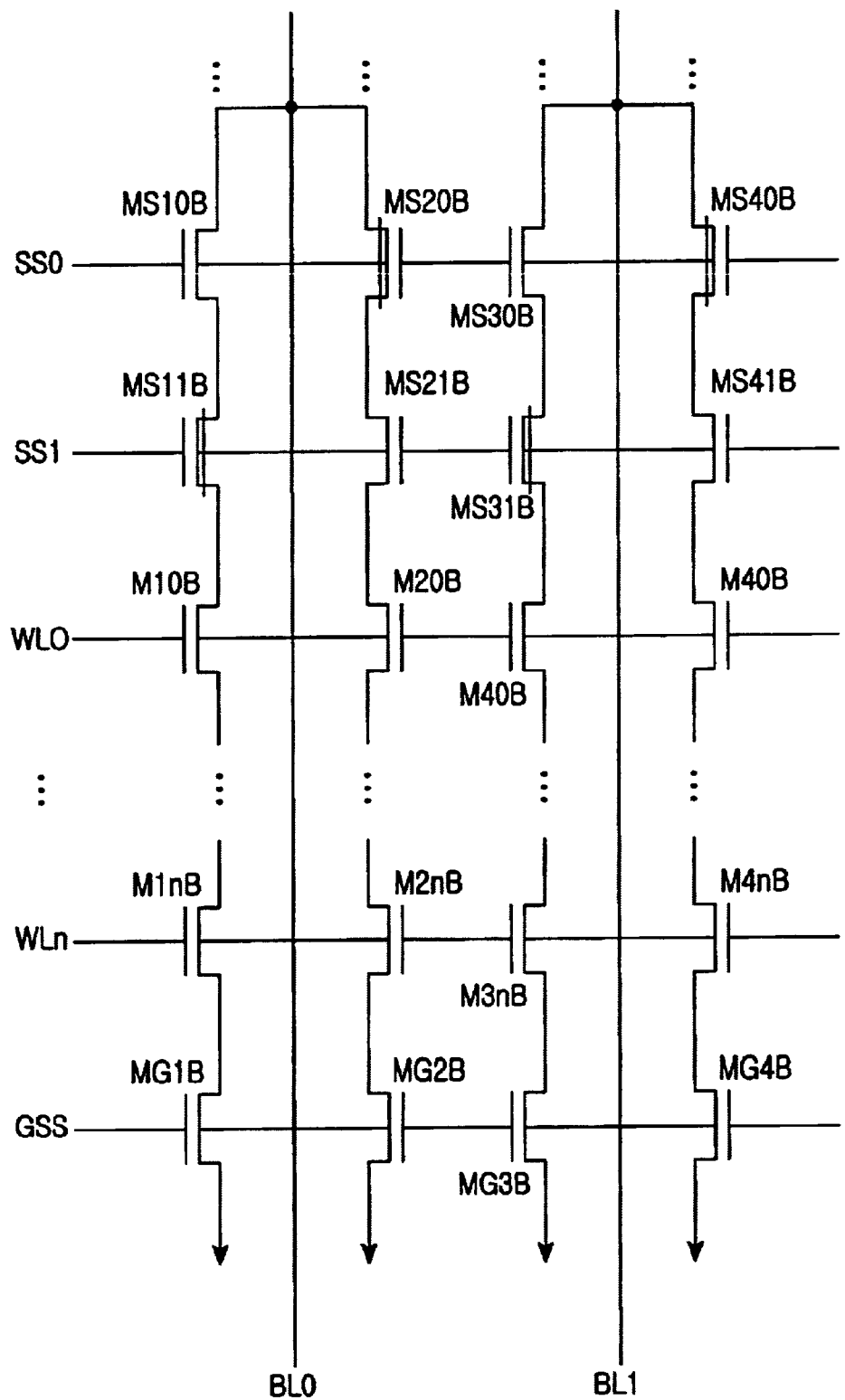
FIG. 2 is a circuit diagram illustrating another example of a cell array with a NAND logic cell structure according to the prior art.
Figure 3A:
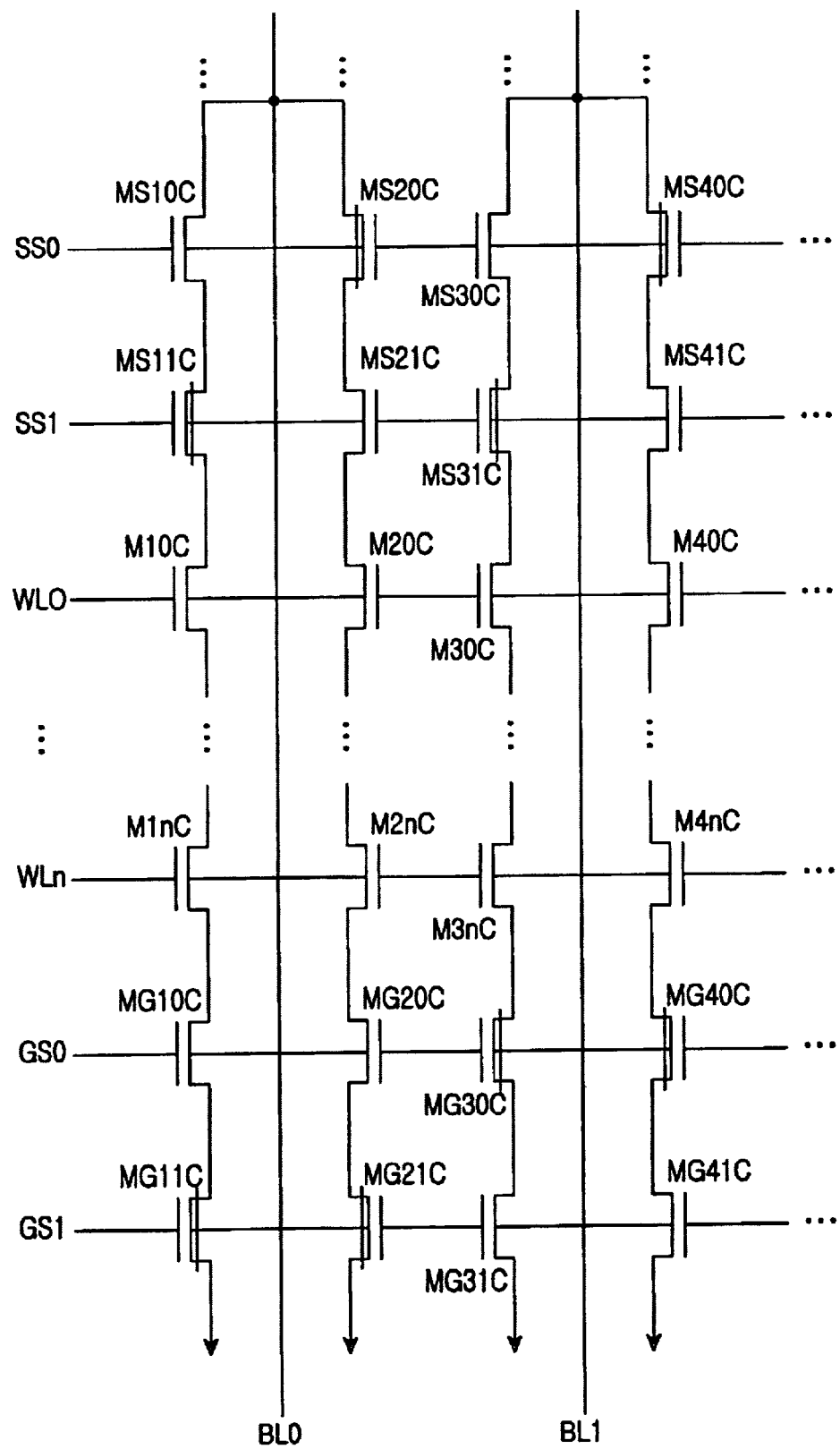
FIG. 3A is a circuit diagram illustrating one embodiment of a cell array with a NAND logic cell structure according to the present invention.

Referring to FIG. 3A a cell array of a nonvolatile semiconductor memory according to the present invention has a memory string which includes a first string select transistor, memory cell transistors and a second string select transistor which are serially connected. Either the first or second string select transistor is controlled by a ground signal instead of a string select signal. Hence, a current path to ground generated by the breakdown of the gate film of any memory cell transistors is not formed.

In the construction of FIG. 3A, two memory strings share one bit line. Each memory string of the NAND structure is constructed such that a string select transistor is serially connected to both sides of series-connected memory cell transistors. That is, a string select transistor MS10C controlled by a string select signal SS0, a string select transistor MS11C controlled by a string select signal SS1, memory cell transistors M10C, . . . , M1nC controlled by word lines WL0, . . . , WLn, a string select and ground select transistor MG10C controlled by a ground select line GS0, and a string select and ground select transistor MG11C controlled by a ground select line GS1 are sequentially connected in series to a first memory string. All other memory strings are constructed in the same manner as the first memory string. Therefore, in each memory string, n memory cell transistors, two string select transistors coupled to one end of the n memory cell transistors, and two string select and ground select transistors coupled to the other end of the n memory cell transistors are serially connected. The voltage levels of the ground select lines GS0 and GS1 connected to control terminals of the string select and ground select transistors are appropriately determined by the operating state of a chip. During the stand-by operation, if the ground select lines GS0 and GS1 are supplied with a ground voltage level, string select and ground select transistors MG10C and MG20C of first and second memory strings, and string select and ground select transistors MG31C and MG41C of third and fourth memory strings are turned off. Therefore, even if the gate film of any memory cell transistor of the first to fourth memory strings is destroyed during the stand-by operation, no current path to ground is formed. Consequently, unnecessary current consumption during the stand-by operation is prevented. The string select transistors consist of a depletion transistor and an enhancement transistor with respect to one memory string. The memory cell transistors are selectively programmed to be either enhancement or depletion transistors. The ground select and string select transistors consist of a depletion transistor and an enhancement transistor with respect to one memory string. In this case, the string select transistors and string select and ground select transistors consist of depletion and enhancement transistors one by one, and their order may be arranged based on the control signals applied thereto.

Figure 3B:
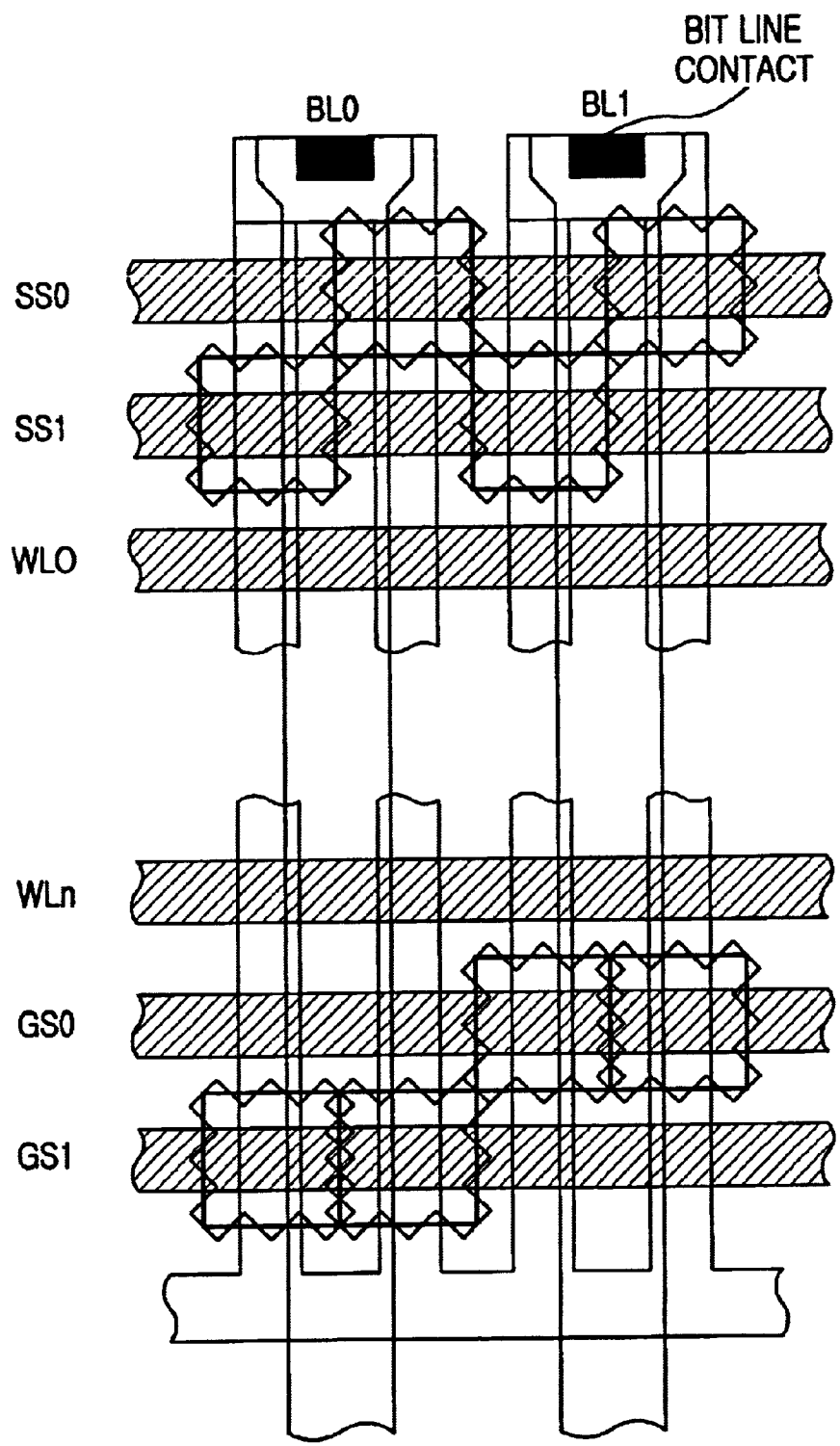
FIG. 3B is a plan view illustrating a layout of FIG. 3A.

Referring to FIG. 3B, on the bit line typically formed of a metal, the string select transistors, memory cell transistors, and string select and ground select transistors are serially connected. The string select lines SS0 and SS1, word lines WL0, . . , WLn and ground select lines GS0 and GS1 for controlling the respective transistors are connected at a cross point between each control signal and each transistor. A plurality of bit line contacts BL0, BL1, . . . are formed in the row direction as well as in the column direction. The bit line contacts connect the bit line to the memory strings.

Figure 4A:
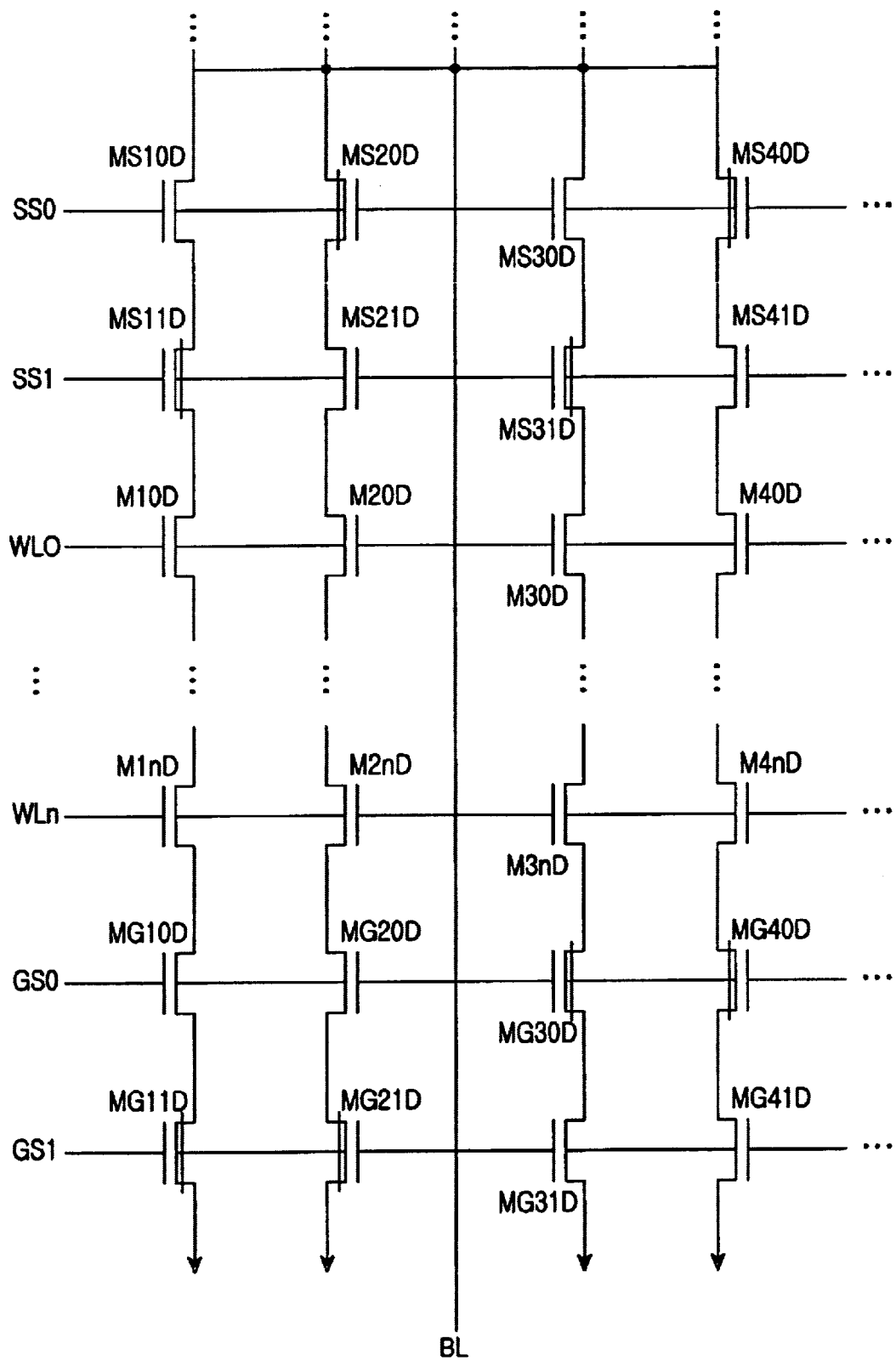
FIG. 4A is a circuit diagram illustrating another embodiment of a cell array with a NAND logic cell structure according to the present invention.
Figure 4B:
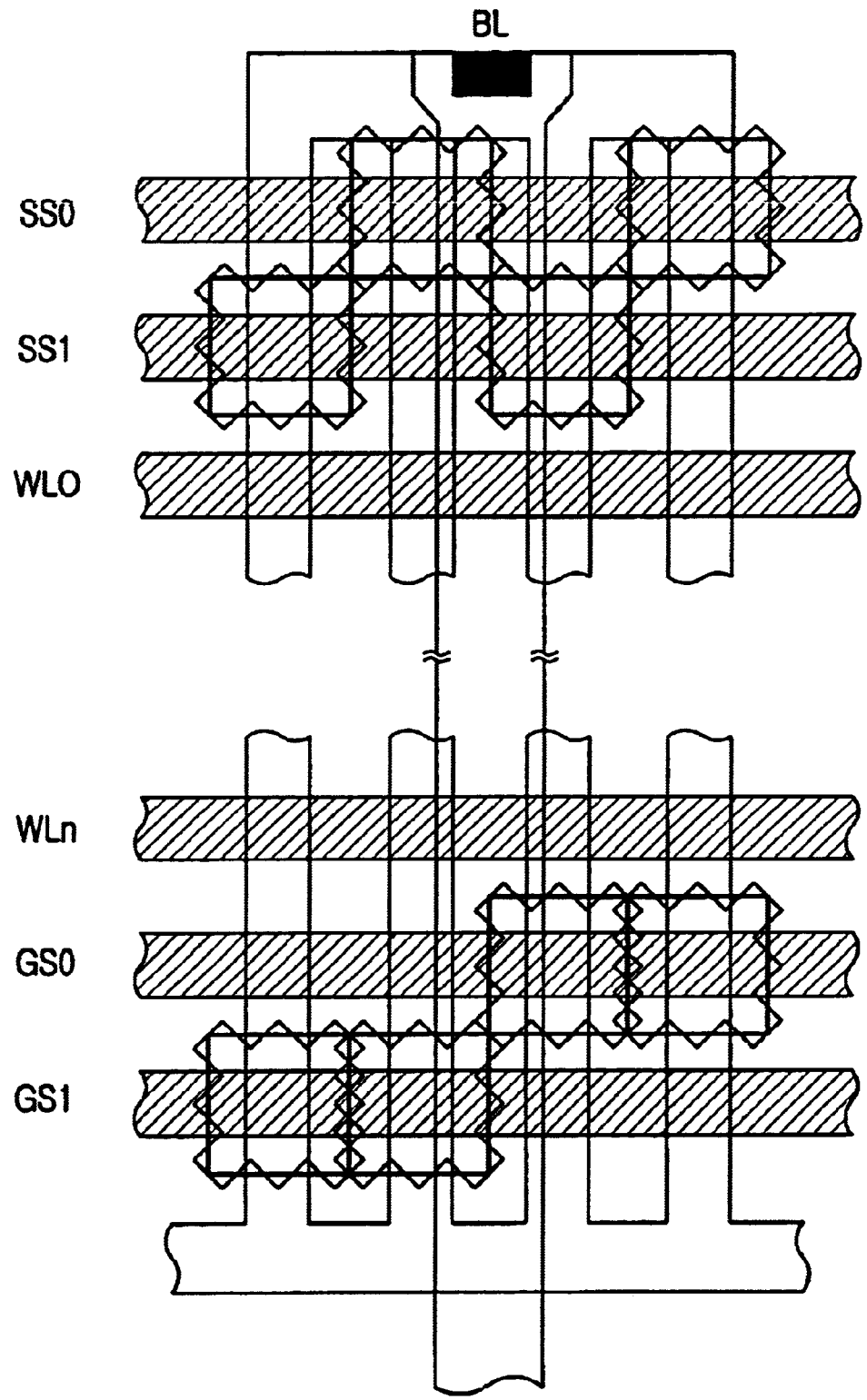
FIG. 4B is a plan view illustrating a layout of FIG. 4A.

FIG. 4A shows another embodiment of a nonvolatile semiconductor memory with a NAND cell array according to the present invention. While in FIG. 3A, two memory strings are connected to one bit line, in FIG. 4A, four memory strings are connected to one bit line in order to enlarge the pitch between bit lines constructed within the chip. Hence, the design of the chip and the manufacturing process thereof can be easily implemented. Each memory string has select transistors, memory cell transistors, and string select and ground select transistors which are serially connected. Namely, string select transistors MS10D and MS11D controlled by string select signals SS0 and SS1, and string select and ground select transistors MG10D and MG11D controlled by ground select signals GS0 and GS1 are respectively connected in series to both sides of memory cell transistors M10D, . . . , M1nD controlled by word lines WL0, . . . , WLn. Each channel of each memory string (FIG. 4A illustrates four memory strings) is commonly connected to one bit line. The string select transistors consist of a depletion transistor and an enhancement transistor with respect to one memory string, and the memory cell transistors are all enhancement transistors. The ground select and string select transistors consist of a depletion transistor and an enhancement transistor with respect to one memory string. In this case, the string select transistors and string select and ground select transistors respectively consist of depletion and enhancement transistors one by one, and their order may be arranged based on the control signals applied thereto. This construction prevents the occurrence of an unnecessary current path to ground due to the breakdown of the gate film of any memory cell during the stand-by operation. Thus, a low power consumption nonvolatile semiconductor memory is achieved. Further, since four memory strings are commonly connected to one bit line, the pitch between bit lines is greater than is the circuit of FIG. 3A. Therefore, shorts between bit lines are prevented and the design and manufacture of a very large scale semiconductor integrated circuit is facilitated. Meanwhile, a layout of the circuit of FIG. 4A is shown in FIG. 4B, where four memory strings are commonly connected to one bit line, and as a result, the pitch between neighboring bit lines is enlarged. Therefore, the layout is simplified and a bridge phenomenon or short of the metal which may occur during the manufacturing process is prevented.

Figure 5:
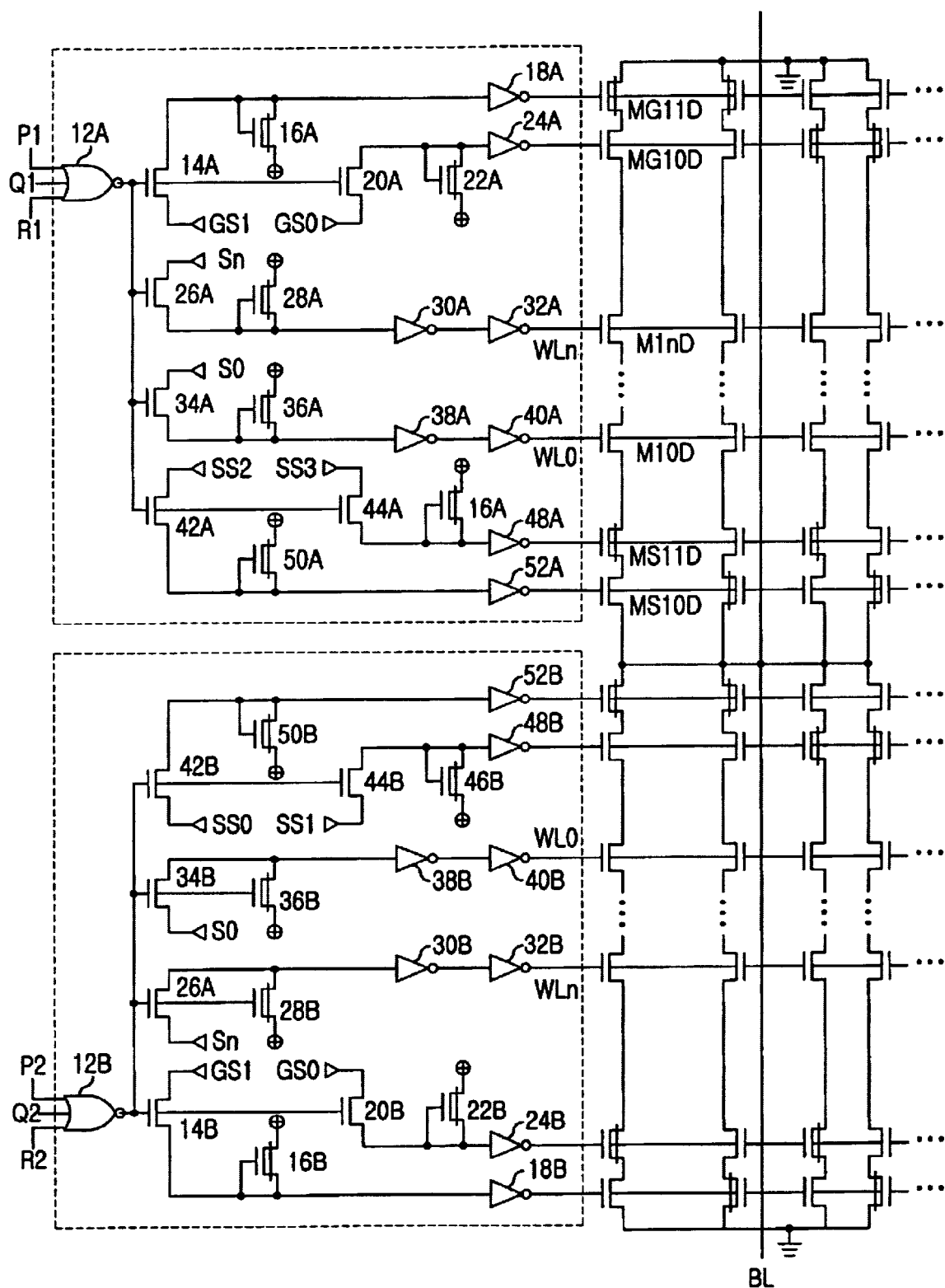
FIG. 5 is a circuit diagram illustrating a row decoder which may be used in the circuits of FIGS. 3A and 4A.

FIG. 5 illustrates a row decoder for decoding the control signals on lines SS0, SS1, WL0, . . . , WLn, GS0 and GS1 shown in FIGS. 3A and 4A. In addition to the memory strings shown in FIG. 5, there are provided a plurality of memory strings in the row and column directions according to the degree of integration. A row decoder is indicated by a dashed line block; FIG. 5 shows two row decoders. Signals applied to lines GS0, GS1, S0, . . . , Sn, and SS0, . . . SS3 are generated from a given predecoder (not shown). The circuit construction and addressing of a predecoder is described in, for example, Korean Patent Application No. 1992-20209, filed Oct. 30, 1992. If the output signals of the predecoder are applied to the row decoder of FIG. 5 and signals on lines P1, Q1 and R1 generated by the combination of an external address are applied to a NOR gate 12A, given string select signals, word lines and ground select signals are respectively selected by the decoding of the signals on lines P1, Q1 and R1. During a select operation the string select signal is set to logic "high" and the word line is set to logic "low", thereby selecting a given memory cell. The ground select signal is set to logic "high" only when the memory string is selected and in other cases, the ground select signal is set to logic "low". In FIG. 5, each depletion transistor is precharged by means well known in the art as disclosed in, for example, Korean Patent Application No. 1989-16428, filed Nov. 13, 1989.

A data access operation will now be described with reference to FIG. 3A through FIG. 5. As will be appreciated by those of skill in the art, in the circuit of FIG. 5, the ground select signals on lines GS0 and GS1 are enabled from the same address used to select a bit line. If the bit line BL0 of FIG. 3A is selected, the ground select line GS0 is set to logic "high" and line GS1 is set to logic "low". If the bit line BL1 is selected, the ground select line GS0 is set to logic "low" and line GS1 is set to logic "high". When the bit line is not selected or in the stand-by state, the ground select lines GS0 and GS1 are set to logic "low". Since the string select and ground select transistors MG11C, MG21C, MG30C and MG40C are all depletion transistors, and MG10C, MG20C, MG31C and MG41C are all enhancement transistors, a corresponding operation is appropriately performed upon application of the ground select lines GS0 and GS1. That is, if the bit line BL0 is selected, the string select and ground select transistors MG31C and MG41C become nonconductive, thereby cutting off the current path between the bit line BL1 and ground. If the bit line BL1 is selected, the string select and ground select transistors MG10C and MG20C become nonconductive, thereby cutting off the current path between the bit line BL0 and ground. This decoding method may also be used in the circuit of FIG. 4A.

While preferred embodiments of the present invention have been shown and described with particularity, it will be understood by those skilled in the art that the foregoing and other changes in form and details may be made without departing from the spirit and scope of the present invention. For example, it may be possible to base the selection of the mode of the string select transistors and string select and ground select transistors based on consideration of the control signals. Although there are shown two unit memory strings connected to one bit line and four unit memory strings connected to one bit line, one bit line may be connected to several unit memory strings. Furthermore, an improved row decoder may be used in the row decoder for the operation of the cell array structure shown in FIGS. 3A and 4A.

As is apparent from the aforementioned description, the nonvolatile semiconductor integrated circuit with a NAND logic memory cell structure embodying the present invention has a cell array construction connected in series between string select means and string select and ground select means. Therefore, unnecessary current consumption during the stand-by state is prevented and a low power semiconductor integrated circuit is achieved. Further, a bridge phenomenon or short between metal lines is suppressed. Even if the bridge phenomenon occurs, it is easily repaired by an error correcting code (ECC) circuit, since no current path to ground is formed. The inventive nonvolatile semiconductor memory with a NAND cell structure will improve the performance of a very large scale nonvolatile semiconductor integrated circuit of 64 Mbits or 256 Mbits in size.

What is claimed is:

1. A nonvolatile semiconductor memory having a cell array including a plurality of memory cells arranged in rows and columns, said memory cells connected to form a plurality of unit memory strings, each string having a first and second end, said nonvolatile semiconductor memory comprising:

at least two string select transistors connected in series to said first end of each said unit memory string and controlled by string select signals, wherein said at least two said string select transistors comprise a depletion mode transistor and an enhancement mode transistor; and at least two ground select transistors connected in series to said second end of each said unit memory string and controlled by ground select signals, wherein said at least two ground select transistors comprise another depletion mode transistor and another enhancement mode transistor.

2. The nonvolatile semiconductor memory of claim 1, wherein said string select signals and said ground select signals are generated by a row decoder.

3. A nonvolatile semiconductor memory having a cell array including a plurality of memory cells arranged in rows and columns, said memory cells being connected to form a plurality of unit memory strings, each string having a first end and a second end, said nonvolatile semiconductor memory comprising:
- a bit line connected to two of said plurality of unit memory strings;
- at least two string select transistors connected in series to said first end of each said unit memory string and controlled by string select signals, wherein said at least two string select transistors comprise a depletion mode transistor and an enhancement mode transistor; and
- at least two ground select transistors connected in series to said second end of each said unit memory string and controlled by ground select signals, wherein said at least two ground select transistors comprise another depletion mode transistor and another enhancement mode transistor.

4. The nonvolatile semiconductor memory of claim 3, wherein said string select signals and said ground select signals are generated by a row decoder.

5. A nonvolatile semiconductor memory having a cell array including a plurality of memory cells arranged in rows and columns, said memory cells being connected for form a plurality of unit memory strings, each string having a first end and a second end, said nonvolatile semiconductor memory comprising:
- a bit line connected to four of said plurality of unit memory strings;
- at least two string select transistors connected in series to said first end of each said unit memory string and controlled by string select signals, wherein said at least two said string select transistors comprise a depletion mode transistor and an enhancement mode transistor; and at least two ground select transistors connected in series to said second end of each said unit memory string and controlled by ground select signals, wherein said at least two ground select transistors comprise another depletion mode transistor and another enhancement mode transistor.

6. The nonvolatile semiconductor memory of claim 5, wherein said string select signals and said gr ound select signals are generated by a row decoder.

7. A nonvolatile semiconductor memory having a cell array including a plurality of memory cells arranged in rows and columns, said memory cells connected to form a plurality of unit memory strings, each string having a first and second end, said nonvolatile semiconductor memory comprising:
- a plurality of first sets of at least two string select transistors, each first set of at least two string select transistors connected in series to the first end of a respective different one of said plurality of unit memory strings and controlled by string select signals, wherein said at least two string select transistors in each first set comprise a depletion mode transistor and an enhancement mode transistor; and
- a plurality of second sets of at least two ground select transistors, each second set of at least two ground select transistors connected in series to the second end of a respective different one of said plurality of unit memory strings and controlled by ground select signals, wherein said at least two ground select transistors in each second set comprise another depletion mode transistor and another enhancement mode transistor.

8. The nonvolatile semiconductor memory of claim 7, wherein said string select signals and said ground select signals are generated by a row decoder.

9. A nonvolatile semiconductor memory having a cell array including a plurality of memory cells arranged in rows and columns, said memory cells being connected to form a plurality of unit memory strings, each string having a first end and a second end, said nonvolatile semiconductor memory comprising:
- a bit line connected to two of said plurality of unit memory strings;
- a plurality of first sets of at least two string select transistors, each first set of at least two string select transistors connected in series to said first end of a respective different one of said plurality of unit memory strings and controlled by string select signals, wherein said at least two string select transistors in each first set comprise a depletion mode transistor and an enhancement mode transistor; and
- a plurality of second sets of at least two ground select transistors, each second set of at least two ground select transistors connected in series to said second end of a respective different one of said plurality of unit memory strings and controlled by ground select signals, wherein said at least two ground select transistors in each second set comprise another depletion mode transistor and another enhancement mode transistor.

10. The nonvolatile semiconductor memory of claim 9, wherein said string select signals and said ground select signals are generated by a row decoder.

11. A nonvolatile semiconductor memory having a cell array including a plurality of memory cells arranged in rows and columns, said memory cells being connected for form a plurality of unit memory strings, each string having a first end and a second end, said nonvolatile semiconductor memory comprising:
- a bit line connected to four of said plurality of unit memory strings;
- a plurality of first sets of at least two string select transistors, each first set of at least two string select transistors connected in series to said first end of a respective different one of said plurality of unit memory strings and controlled by string select signals, wherein said at least two string select transistors in each first set comprise a depletion mode transistor and an enhancement mode transistor; and
- a plurality of second sets of at least two ground select transistors, each second set of at least two ground select transistors connected in series to said second end of a respective different one of said plurality of unit memory strings and controlled by ground select signals, wherein said at least two ground select transistors in each second set comprise another depletion mode transistor and another enhancement mode transistor.

12. The nonvolatile semiconductor memory of claim 11, wherein said string select signals and said ground select signals are generated by a row decoder.

* * * * *